(12) United States Patent
Kim et al.

(10) Patent No.: US 9,725,801 B2
(45) Date of Patent: Aug. 8, 2017

(54) METHOD FOR IMPLANTED-ION ASSISTED GROWTH OF METAL OXIDE NANOWIRES AND PATTERNED DEVICE FABRICATED USING THE METHOD

(71) Applicant: INDUSTRY-ACADEMIC COOPERATION FOUNDATION YONSEI UNIVERSITY, Seoul (KR)

(72) Inventors: Jongbaeg Kim, Goyang-si (KR); Hyungjoo Na, Seongnam-si (KR); Dae-Hyun Baek, Seoul (KR); Kyoung Hoon Lee, Seoul (KR); Jungwook Choi, Seoul (KR); Jaesam Sim, Seoul (KR)

(73) Assignee: INDUSTRY-ACADEMIC COOPERATION FOUNDATION YONSEI UNIVERSITY, Seoul (KR)

( * ) Notice: Subject to any disclaimer, the term of this patent is extended or adjusted under 35 U.S.C. 154(b) by 192 days.

(21) Appl. No.: 14/571,519

(22) Filed: Dec. 16, 2014

(65) Prior Publication Data

US 2015/0167154 A1    Jun. 18, 2015

(30) Foreign Application Priority Data

Dec. 17, 2013  (KR) .................. 10-2013-0157282

(51) Int. Cl.
| | |
|---|---|
| *C23C 14/48* | (2006.01) |
| *C23C 14/04* | (2006.01) |
| *C23C 28/04* | (2006.01) |
| *C23C 14/08* | (2006.01) |
| *C23C 14/58* | (2006.01) |

(52) U.S. Cl.
CPC .............. *C23C 14/48* (2013.01); *C23C 14/08* (2013.01); *C23C 14/5806* (2013.01); *C23C 14/5833* (2013.01); *Y10T 428/24802* (2015.01)

(58) Field of Classification Search
CPC ..... C23C 14/48; C23C 14/08; C23C 14/5833; C23C 14/5806
See application file for complete search history.

(56) References Cited

U.S. PATENT DOCUMENTS

| | | | | | |
|---|---|---|---|---|---|
| 4,976,987 | A | * | 12/1990 | Musket .................. | C23C 14/48 204/192.15 |
| 2009/0235862 | A1 | * | 9/2009 | Cha ........................ | C30B 25/00 117/94 |

FOREIGN PATENT DOCUMENTS

| | | |
|---|---|---|
| JP | 2010-156038 A | 7/2010 |
| JP | 2012-232890 A | 11/2012 |
| KR | 10-0643083 B1 | 10/2006 |

(Continued)

OTHER PUBLICATIONS

Yongho Choi, Jason L Johnson and Ant Ural. Patterned growth of silicon oxide nanowires from iron ion implanted Si02 substrates. IOP Publishing. Nanotechnology. 20 (2009) 135307.*

(Continued)

*Primary Examiner* — Dah-Wei D Yuan
*Assistant Examiner* — Kristen A Dagenais
(74) *Attorney, Agent, or Firm* — LRK Patent Law Firm

(57) ABSTRACT

An embodiment of the present disclosure provides a method of growing metal oxide nanowires by ion implantation, the method including the steps of: depositing a metal oxide thin film on a substrate; implanting ions into the metal oxide thin film; and heating the ion-implanted metal oxide thin film to grow metal oxide nanowires.

12 Claims, 7 Drawing Sheets

(56) References Cited

FOREIGN PATENT DOCUMENTS

| KR | 10-0788796 B1 | 12/2007 |
| KR | 10-2008-0030067 A | 4/2008 |
| KR | 10-0822745 B1 | 4/2008 |
| KR | 10-2010-0089414 A | 8/2010 |
| KR | 10-2011-0027289 A | 3/2011 |
| KR | 2013-0039017 A | 4/2013 |
| KR | 2013-0055309 A | 5/2013 |

OTHER PUBLICATIONS

Gu G. et al., "Tungsten Oxide Nanowires on Tungsten", Nano Lett. 2002, 2, 849-851.
Ham J. et al., "Direct Growth of Compound Semiconductor Nanowires by On-Film Formation of Nanowires Bismuth Telluride", Nano Lett. 2009, 9, 2867-2872.
Aur'Eliepierret et al., "Generic nano-imprint process for fabrication of nanowire arrays", Nanotechnology, 2010, 21, 065305.
Daniel S. Engstrom et al., "High Throughput Nanofabrication of Silicon Nanowire and CarbonNanotube Tips on AFM Probes by Stencil-Deposited", Nano Lett., 2011, 11, 1568-1574.

* cited by examiner

METHOD FOR IMPLANTED-ION ASSISTED GROWTH OF METAL OXIDE NANOWIRES AND PATTERNED DEVICE FABRICATED USING THE METHOD

CROSS-REFERENCE TO RELATED APPLICATIONS

This application claims priority to Korean Application No. 10-2013-0157282, filed Dec. 17, 2013, the contents of which are incorporated herein in their entirety.

BACKGROUND

The present disclosure relates to a method for growing metal oxide nanowires and a patterned metal oxide device fabricated using the same, and more particularly, to a method of growing metal oxide nanowires by ion implantation and patterned metal oxide device fabricated using the same.

As an interest in the research and development of nanowires has continuously and rapidly increased, studies on methods for synthesis of various nanowires, the analysis of the properties of nanowires, and the fields of application of nanowires have been actively conducted. To develop devices to which nanowires are applied, technology for controlling the synthesis of nanowires is necessarily required.

Studies on the position, number, density and the like of nanowires have been largely conducted in three directions. These studies include studies on the development of devices by the movement and assembly of nanowires synthesized in large amounts, studies on the development of a technology for controlling the number and position of nanowires by the control of synthesis of nanowires and on the application of the technology to devices, and the changes in physical and chemical properties of individual nanowires by the control of the size and shape thereof.

Particularly, methods combined with nanoscale lithography, which have been mainly used in the prior art, involve complex processes, or are limited to research technologies unsuitable for mass production. Thus, these methods become a big obstacle to the application of nanowires to various devices and the mass production of nanowires.

In previous studies, the literature (Daniel S. Engstrom, Veronica Savu, Xueni Zhu, Ian Y. Y. Bu, William I. Milne, Juergen Brugger, and Peter Boggild, NanoLett., 2011, 11, 1568-1574 "High Throughput Nanofabrication of Silicon Nanowire and CarbonNanotube Tips on AFM Probes by Stencil-Deposited Catalysts") discloses fabricating AFM probes by synthesizing one-dimensional Si nanostructures and one-dimensional structures such as CNTs on cantilever arrays by depositions of catalysts using a nanostencil lithography technique.

In addition, the literature (Aur'eliePierret, Mo"iranocevar, Silke L Diedenhofen, Rienk E Algra, E Vlieg, Eugene C Timmering, Marc A Verschuuren, George W G Immink, Marcel A Verheijen, and Erik P A M Bakkers, Nanotechnology, 2010, 21, 065305 "Generic nano-imprint process for fabrication of nanowire arrays") discloses fabricating two-dimensional nanostructure arrays by forming poly-di-methyl-siloxane (PDMS) stamps on a substrate using a nanoimprint technique and depositing catalysts at certain intervals on the substrate using the formed stamps.

Moreover, the literature (Gu, G.; Zheng, B.; Han, W. Q.; Roth, S.; Liu, J. Nano Lett. 2002, 2, 849-851. "Tungsten Oxide Nanowires on Tungsten") discloses synthesizing metal oxide nanowires by a vapor-solid (VS) mechanism and oxidizing a tungsten substrate at high temperature to grow the nanowires.

Further, the literature (Ham, J.; Shim, W.; Kim, D. H.; Lee, S.; Roh, J.; Sohn, S. W.; Oh, K. H.; Voorhees, P. W.; Lee, W. Nano Lett. 2009, 9, 2867-2872. "Direct Growth of Compound Semiconductor Nanowires by On-Film Formation of Nanowires Bismuth Telluride") discloses synthesizing BiTe nanowires by a compressive stress method.

Among methods for synthesizing nanowires, the compressive stress method does not require a catalyst and a precursor, and thus the process is easy and convenient. Also, the compressive stress method is easy to apply to devices. However, the compressive stress method according to the prior art has problems in that, because synthesis should be performed at a relatively high temperature, it is difficult to fabricate nanowire devices, and it is also difficult to form precise patterns.

BRIEF SUMMARY

Embodiments of the present disclosure are intended to grow nanowires at a relatively low temperature compared to that in a conventional compressive stress method by depositing metal oxide on a silicon substrate, implanting ions into a portion of the substrate, on which patterns are to be formed, and heating the ion-implanted portion. Also, embodiments of the present disclosure are intended to grow optimal nanowires by controlling the kind and accelerating voltage of ions implanted and to form desired patterns on a substrate by partial ion implantation.

In accordance with an aspect of the present disclosure, there is provided a method of growing metal oxide nanowires by ion implantation, the method including the steps of: depositing a metal oxide thin film on a substrate; implanting ions into the metal oxide thin film; and heating the ion-implanted metal oxide thin film to grow metal oxide nanowires.

The substrate may be a silicon substrate, and the step of depositing the metal oxide thin film may be performed using an electron beam evaporator or a sputtering system.

The metal oxide thin film deposited in the step of depositing the metal oxide thin film may have a thickness of 10-20 nm, and the ions that are implanted in the step of implanting the ions may be ions of at least one selected from the group consisting of Ga, As, Ar, $N_2$, and B.

The step of implanting the ions may be performed by implanting the ions using a focused ion beam system or an ion implanter system.

The method may further include, after the step of depositing the metal oxide thin film, a step of placing a shadow mask for partial ion implantation.

The ions may be implanted using the focused ion beam system through patterns formed on a portion of the metal oxide thin film, and the ions may be implanted at a dose of $1-9 \times 10^{15}$ ions/$cm^2$ in the step of implanting the ions.

The dose or accelerating voltage of the ions that are implanted in the step of implanting the ions may be controlled according to the kind of ions and the state of the metal oxide thin film.

The step of heating the ion-implanted metal oxide film may be performed using a heating furnace. The heating furnace may be heated in a vacuum by introducing at least one inert gas, selected from nitrogen, argon and helium, by using a pump. The step of heating the ion-implanted metal oxide film may be performed at a temperature of about 600° C.

In accordance with another aspect of the present disclosure, there is provided a patterned metal oxide nanowire device fabricated using a method of growing metal oxide nanowires by ion implantation, the method including the steps of: depositing a metal oxide thin film on a substrate; implanting ions into the metal oxide thin film; and heating the ion-implanted metal oxide thin film to grow metal oxide nanowires, wherein metal oxide nanowire patterns are formed on a portion of the metal oxide thin film, into which the ions were implanted in the step of implanting the ions.

The substrate may be a silicon substrate, and the step of depositing the metal oxide thin film may be performed using an electron beam evaporator or a sputtering system.

The metal oxide thin film deposited in the step of depositing the metal oxide thin film may have a thickness of 10-20 nm, and the ions that are implanted in the step of implanting the ions may be ions of at least one selected from the group consisting of Ga, As, Ar, $N_2$, and B.

The step of implanting the ions may be performed by implanting the ions using a focused ion beam system or an ion implanter system.

The method may further include, after the step of depositing the metal oxide thin film, a step of placing a shadow mask for partial ion implantation.

The ions may be implanted using the focused ion beam system through patterns formed on a portion of the metal oxide thin film, and the ions may be implanted at a dose of $1$-$9 \times 10^{15}$ ions/$cm^2$ in the step of implanting the ions.

The dose or accelerating voltage of the ions that are implanted in the step of implanting the ions may be controlled according to the kind of ions and the state of the metal oxide thin film.

The step of heating the ion-implanted metal oxide film may be performed using a heating furnace. The heating furnace may be heated in a vacuum by introducing at least one inert gas, selected from nitrogen, argon and helium, by using a pump. The step of heating the ion-implanted metal oxide film may be performed at a temperature of about 600° C.

According to embodiments of the present disclosure, nanowires may be grown at a relatively low temperature compared to that in a conventional compressive stress method by depositing metal oxide on a silicon substrate, implanting ions into a portion of the substrate, on which patterns are to be formed, and heating the ion-implanted portion.

In addition, optimal nanowires may be grown by controlling the kind and accelerating voltage of ions implanted, and desired patterns may be formed on a substrate by partial ion implantation.

DETAILED DESCRIPTION

Reference will be now made in detail to embodiments of the present disclosure with reference to the attached drawings. It will be understood that words or terms used in the specification and claims shall not be interpreted as the meaning defined in commonly used dictionaries. It will be further understood that the words or terms should be interpreted as having a meaning that is consistent with their meaning in the context of the relevant art and the technical idea of the disclosure.

Figure 1:
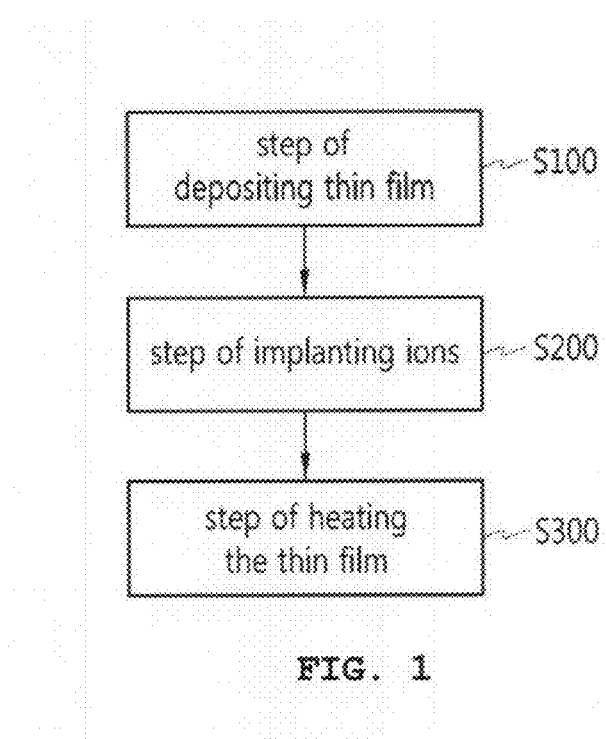
FIG. 1 is a flow chart showing a process for growing nanowires according to an embodiment of the present disclosure.
Figure 2:
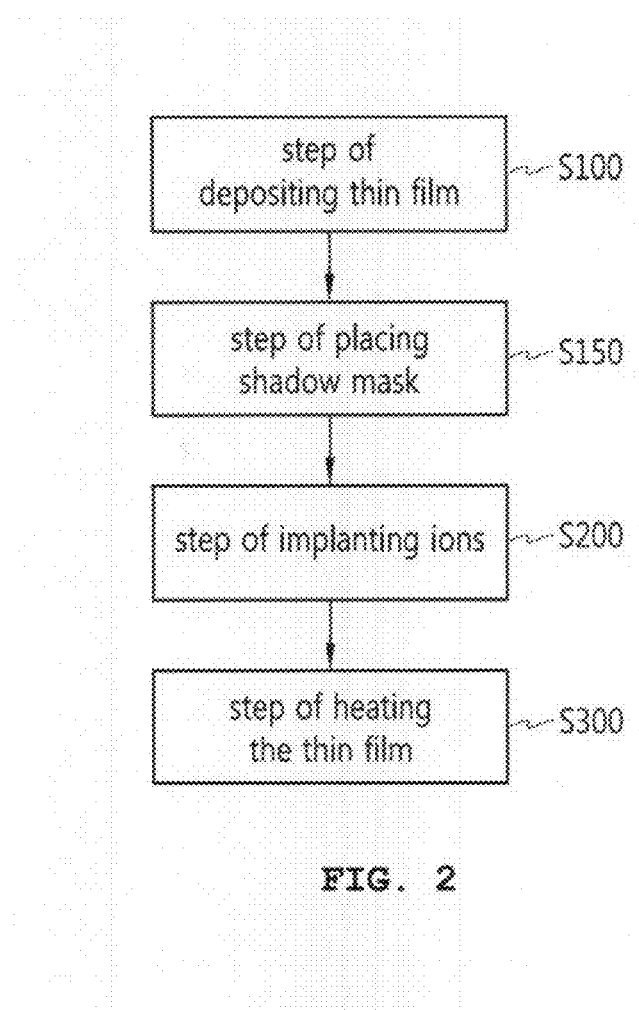
FIG. 2 is a flow chart showing a process of growing nanowires after pattern formation according an embodiment of the present disclosure.
Figure 3:
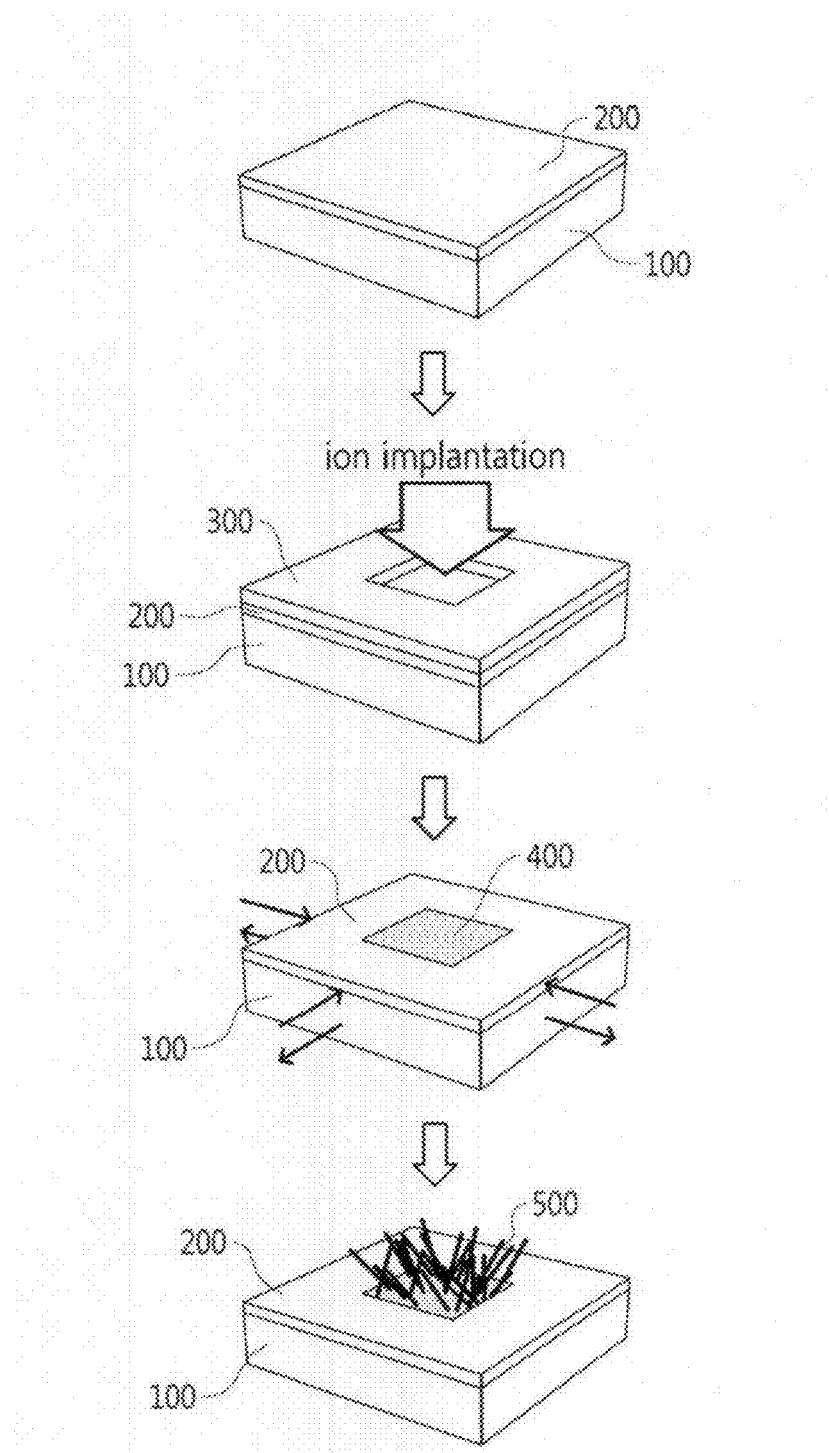
FIG. 3 shows a process of growing nanowires using an ion implanter according to an embodiment of the present disclosure.
Figure 4:
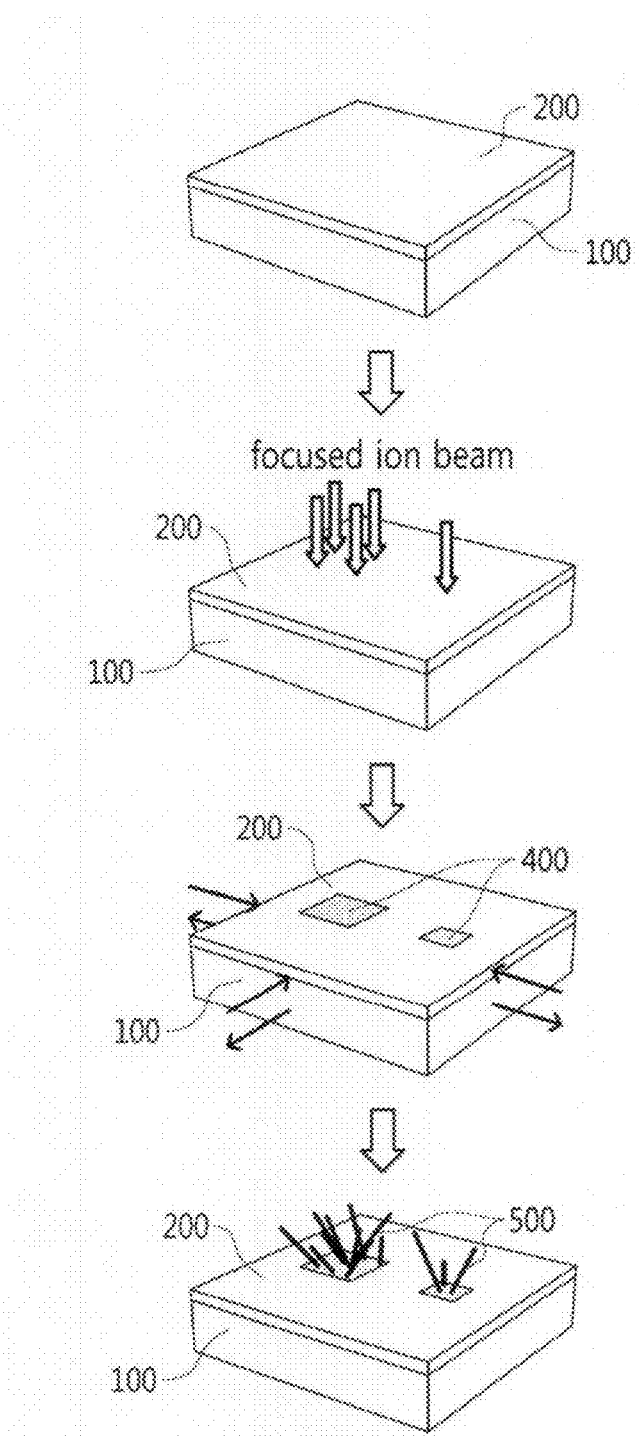
FIG. 4 shows a process of growing nanowires using a focused ion beam according to an embodiment of the present disclosure.
Figure 5A:
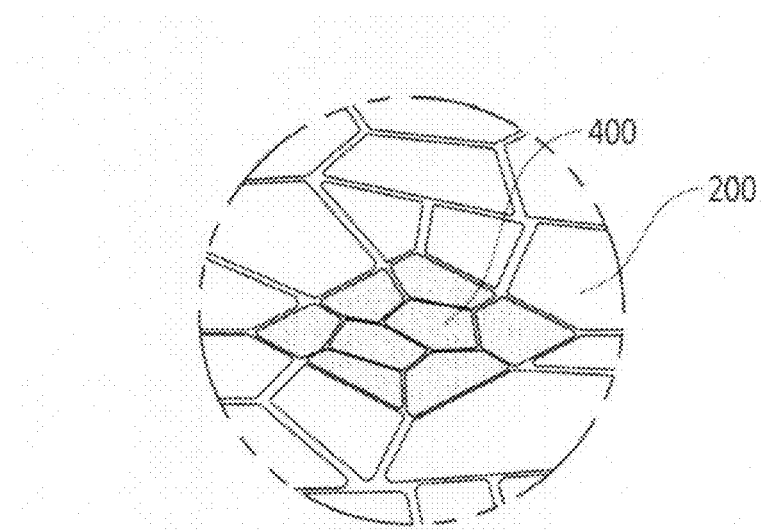
FIGS. 5A and 5B show nanowires grown according to an embodiment of the present disclosure.
Figure 5B:
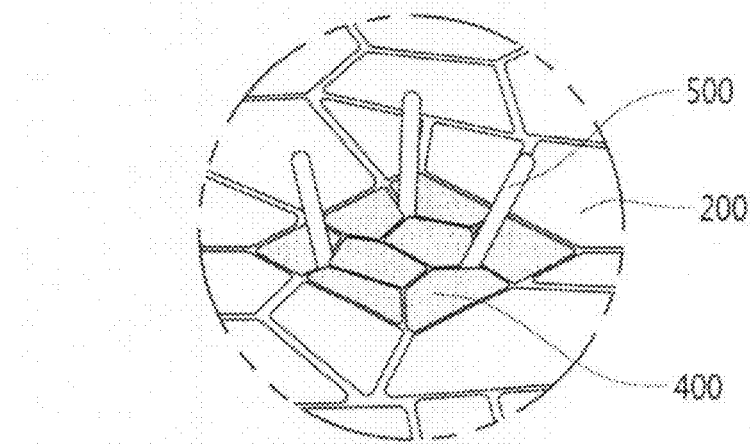

FIG. 1 is a flow chart showing a process for growing nanowires 500 according to an embodiment of the present disclosure; FIG. 2 is a flow chart showing a process of growing nanowires 500 after pattern formation according an embodiment of the present disclosure; FIG. 3 shows a process of growing nanowires 500 using an ion implanter 400 according to an embodiment of the present disclosure; FIG. 4 shows a process of growing nanowires 500 using a focused ion beam according to an embodiment of the present disclosure; and FIGS. 5A and 5B show nanowires 500 grown according to an embodiment of the present disclosure.

Referring to FIGS. 1 to 5B, a method of growing metal oxide by implantation of ions 400 according to an aspect of the present disclosure includes the steps of: (S100) depositing a metal oxide thin film 200 on a substrate 100; (S200) implanting ions 400 into the metal oxide thin film 200; and (S300) heating the ion-implanted metal oxide thin film 200 to grow metal oxide nanowires 500.

The substrate 100 may be a silicon substrate or the like, and an electron-beam evaporator or a sputtering system may be used to deposit metal oxide on the substrate 100.

The thickness of the metal oxide thin film 200 deposited in step (S100) of depositing the metal oxide thin film may be 10-20 nm, and may be controlled if necessary.

After the substrate 100 having the metal oxide thin film 200 deposited thereon is provided, ions 400 are implanted into a portion of the substrate 100, on which patterns are to be formed.

If the ions 400 are implanted throughout the substrate 100, the nanowires 500 will grow through the substrate 100. For this reason, if patterns are to be formed, a mask 300 is placed over the substrate 100 so that the ions 400 are implanted into only a portion of the substrate 100, on which the patterns are to be formed. Herein, the ions 400 may be implanted into a selected portion of the substrate 100 using the mask 300 and a focused ion beam system. When the focused ion beam system is used, desired patterns are formed using the program of the focused ion beam system while the ions 400 are implanted into a portion of the substrate 100.

The ions 400 that are ion implanting step (S200) are ions of at least one selected from among Ga, As, Ar, $N_2$, B and the like, and the ions 400 are implanted at a dose of $1$-$9 \times 10^{15}$ ions/$cm^2$. In addition, the dose or accelerating voltage of the ions 400 that are implanted in ion implanting step (S200)

may be controlled according to the kind of ions 400 or the state of the metal oxide thin film.

Heating step (S300) following the ion implanting step is performed by heating the substrate in a heating furnace. In heating step S300, compressive stress occurs throughout the metal oxide thin film, but the portion implanted with the ions 400 reaches a compressive stress enough to grow the nanowires 500 even at a relatively low temperature due to a compressive stress added by the implanted ions 400, and thus the nanowires grow in the ion-implanted portion.

The minimum temperature required for the growth of the nanowires 500 without ion implantation is 700° C.

Figure 6:
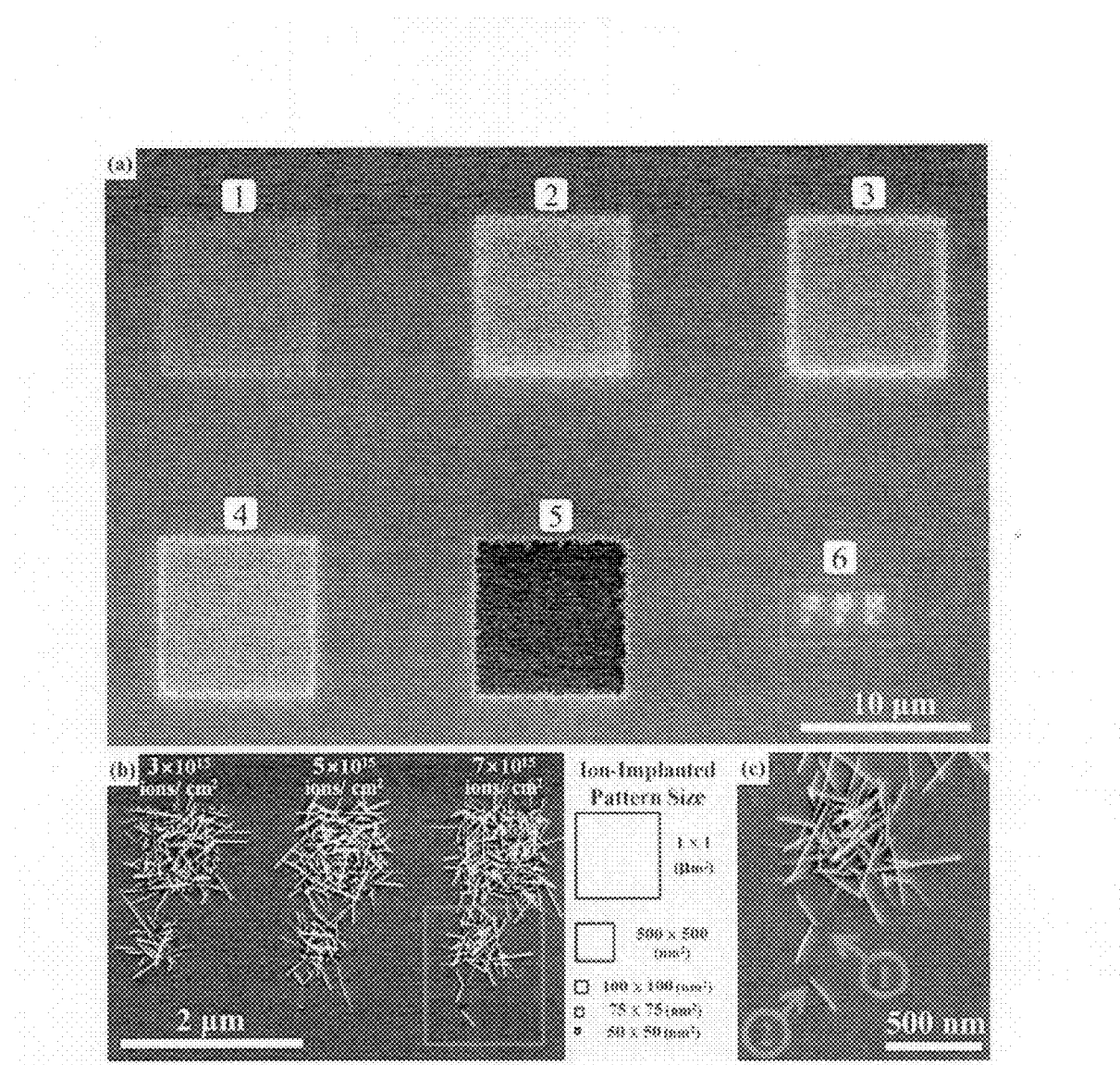
FIG. 6 is a scanning electron micrograph (SEM) showing the results of partially synthesizing tungsten nanowires using a focused ion beam system according to an embodiment of the present disclosure.

FIG. 6 is a scanning electron micrograph (SEM) showing the results of partially synthesizing tungsten nanowires 500 using a focused ion beam system according to an embodiment of the present disclosure. FIG. 6(a) depicts square patterns 1 to 5 showing the results of implanting Ga ions 400 at varying doses of $1\times10^{15}$, $3\times10^{15}$, $5\times10^{15}$, $7\times10^{15}$ and $9\times10^{15}$ ions/cm$^2$, followed by heating at 600° C. Pattern 6 in FIG. 6(a) showing the results of partially synthesizing nanowires using nanosized patterns, and is shown as an enlarged view in FIG. 6(b). Particularly, FIG. 6(c) that is an enlarged view of FIG. 6(b) shows the results of synthesizing nanowires 500 in a 75×75 nm$^2$ pattern implanted with ions 400.

Figure 7:
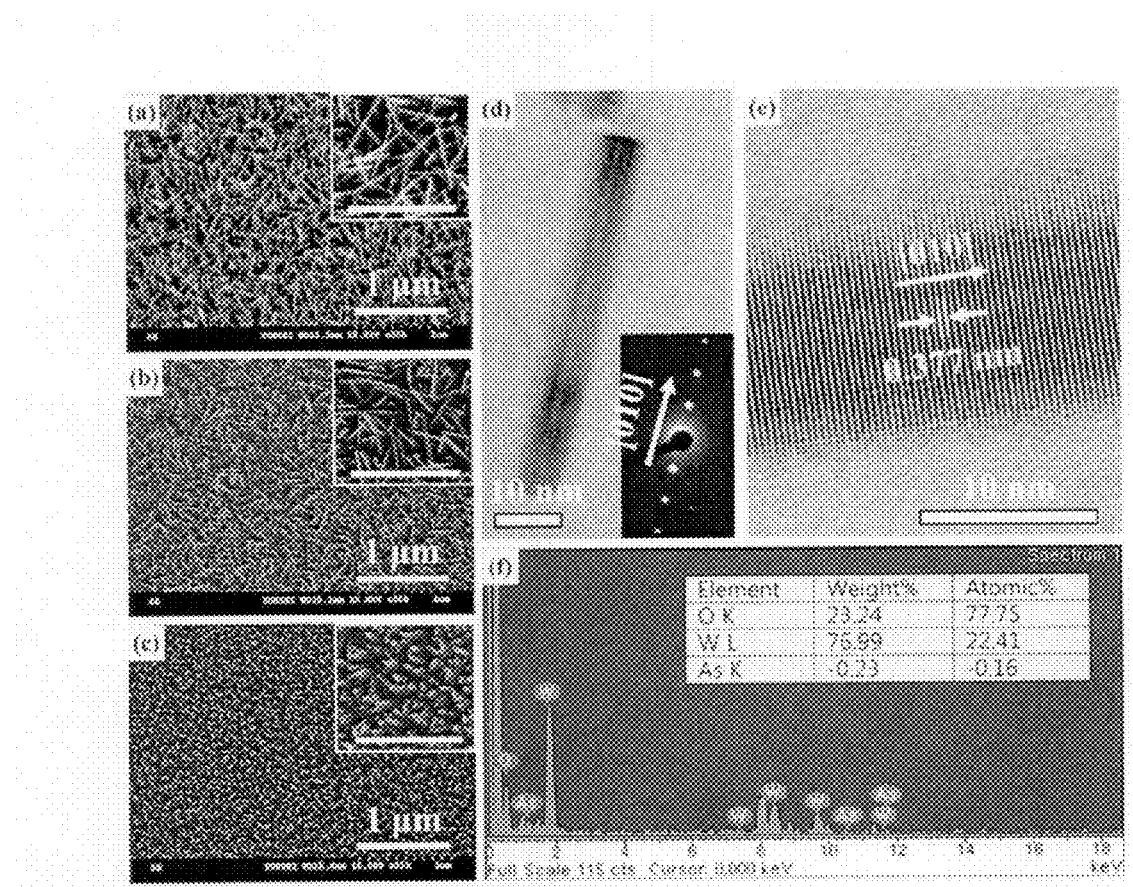
FIG. 7 shows a scanning electron micrograph and transmission electron micrograph (TEM) of tungsten oxide nanowires synthesized at a low temperature by implanting various ions, including As, Ar and $N_2$, using an ion implanter according to an embodiment of the present disclosure.

FIG. 7 shows a scanning electron micrograph and transmission electron micrograph (TEM) of tungsten oxide nanowires synthesized at a low temperature by implanting various ions 400, including As, Ar and N$_2$, at a dose of $5\times10^{15}$ ions/cm$^2$ using an ion implanter according to an embodiment of the present disclosure. FIGS. 7(a) to 7(c) are photographs and their enlarged photographs, which show the results of synthesizing nanowires 500 at 600° C. by implanting As, Ar and N$_2$ ions 400, respectively. FIG. 7(d) shows the results of transmission electron microscopy of the nanowires 500 shown in FIG. 7(a), and FIGS. 7(e) and 7(f) show the crystalline structure and components of the nanowires 500.

In accordance with another aspect of the present disclosure, there is provided a patterned metal oxide nanowire device fabricated using a method of growing metal oxide nanowires by ion implantation, the method including the steps of: (S100) depositing a metal oxide thin film 200 on a substrate 100; (S200) implanting ions 400 into the metal oxide thin film 200; and (S300) heating the ion-implanted metal oxide thin film 200 to grow metal oxide nanowires 500, wherein patterns of the metal oxide nanowires 500 are formed on a portion of the metal oxide thin film 500, into which the ions 400 were implanted in step (S200) of implanting the ions. Herein, the features of each component of the patterned metal oxide nanowire device are as described above.

Further, the embodiments discussed have been presented by way of example only and not limitation. Thus, the breadth and scope of the invention(s) should not be limited by any of the above-described exemplary embodiments, but should be defined only in accordance with the following claims and their equivalents. Moreover, the above advantages and features are provided in described embodiments, but shall not limit the application of the claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A method of growing metal oxide nanowires by ion implantation, the method comprising the steps of:
    depositing a metal oxide thin film on a substrate;
    implanting ions into the metal oxide thin film; and
    heating the ion-implanted metal oxide thin film to grow metal oxide nanowires,
    wherein the ions that are implanted in the step of implanting the ions are ions of at least one selected from the group consisting of Ga, As, Ar, N$_2$ and B.

2. The method of claim 1, wherein the substrate is a silicon substrate.

3. The method of claim 1, wherein the step of depositing the metal oxide thin film is performed using an electron beam evaporator or a sputtering system.

4. The method of claim 1, wherein the metal oxide thin film deposited in the step of depositing the metal oxide thin film has a thickness of 10-20 nm.

5. The method of claim 1, wherein the step of implanting the ions is performed by implanting the ions using a focused ion beam system or an ion implanter system.

6. The method of claim 1, further comprising, after the step of depositing the metal oxide thin film, a step of placing a shadow mask over the metal oxide thin film in order to implant the ions into a portion of metal oxide thin film.

7. The method of claim 5, wherein the ions are implanted using the focused ion beam system through patterns formed on a portion of the metal oxide thin film.

8. The method of claim 1, wherein the ions are implanted at a dose of $1\times10^{15}$~$9\times10^{15}$ ions/cm$^2$ in the step of implanting the ions.

9. The method of claim 1, wherein a dose or accelerating voltage of the ions that are implanted in the step of implanting the ions is controllable according to the kind of ions and the state of the metal oxide thin film.

10. The method of claim 1, wherein the step of heating the ion-implanted metal oxide film is performed using a heating furnace.

11. The method of claim 10, wherein the heating furnace is heated in a vacuum by introducing at least one gas, selected from the group consisting of nitrogen, argon and helium, by using a pump.

12. The method of claim 1, wherein the step of heating the ion-implanted metal oxide film is performed at a temperature of about 600° C.

* * * * *